(12) United States Patent
Shin

(10) Patent No.: US 11,026,327 B2
(45) Date of Patent: Jun. 1, 2021

(54) PRINTED CIRCUIT BOARD

(71) Applicant: LG INNOTEK CO., LTD., Seoul (KR)

(72) Inventor: Heun Gun Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/634,698

(22) PCT Filed: Jul. 27, 2018

(86) PCT No.: PCT/KR2018/008582
§ 371 (c)(1),
(2) Date: Jan. 28, 2020

(87) PCT Pub. No.: WO2019/022580
PCT Pub. Date: Jan. 31, 2019

(65) Prior Publication Data
US 2020/0205284 A1 Jun. 25, 2020

(30) Foreign Application Priority Data

Jul. 28, 2017 (KR) .......................... 10-2017-0096521

(51) Int. Cl.
*H05K 1/02* (2006.01)
*H05K 1/11* (2006.01)
(Continued)

(52) U.S. Cl.
CPC ......... *H05K 1/0298* (2013.01); *H05K 1/0313* (2013.01); *H05K 1/115* (2013.01);
(Continued)

(58) Field of Classification Search
CPC .... H05K 1/0298; H05K 1/0313; H05K 1/115; H05K 3/428; H05K 3/465;
(Continued)

(56) References Cited

U.S. PATENT DOCUMENTS 7,012,197 B2 * 3/2006 Harada ................ H05K 1/0242
174/255
9,161,454 B2 * 10/2015 Tseng ...................... H01L 24/19
(Continued)

FOREIGN PATENT DOCUMENTS

KR 10-2008-0096985 A 11/2008
KR 10-0897650 B1 5/2009
(Continued)

OTHER PUBLICATIONS

International Search Report in International Application No. PCT/KR2018/008582, filed Jul. 27, 2018.

*Primary Examiner* — Ishwarbhai B Patel
(74) *Attorney, Agent, or Firm* — Saliwanchik, Lloyd & Eisenschenk

(57) ABSTRACT

According to one embodiment, the present invention relates to a printed circuit board, comprising: a first insulating layer; an inner layer circuit pattern disposed on an upper surface of the first insulating layer; a second insulating layer, disposed on the first insulating layer, for covering the inner layer circuit pattern; a first outer layer circuit pattern integrated into a lower surface of the first insulating layer; and a second outer layer circuit pattern embedded in an upper surface of the second insulating layer, the first insulating layer comprising a thermosetting resin, and the second insulating layer comprising a photocurable resin.

11 Claims, 11 Drawing Sheets

(51) Int. Cl.
  *H05K 1/03*   (2006.01)
  *H05K 3/42*   (2006.01)
  *H05K 3/46*   (2006.01)
(52) U.S. Cl.
  CPC ............. *H05K 3/428* (2013.01); *H05K 3/465* (2013.01); *H05K 2201/0209* (2013.01); *H05K 2201/09563* (2013.01)
(58) Field of Classification Search
  CPC . H05K 2201/0209; H05K 2201/09563; H05K 1/03; H05K 3/10; H05K 3/28; H05K 3/46
  See application file for complete search history.

(56) References Cited

U.S. PATENT DOCUMENTS

| | | | |
|---|---|---|---|
| 9,693,455 B1* | 6/2017 | Park | H05K 1/186 |
| 2008/0264684 A1 | 10/2008 | Kang et al. | |
| 2009/0046441 A1* | 2/2009 | Funaya | H01L 23/49822 361/783 |
| 2009/0106977 A1* | 4/2009 | Kim | H05K 3/107 29/852 |
| 2012/0222299 A1* | 9/2012 | Mok | H05K 3/107 29/846 |
| 2013/0192881 A1 | 8/2013 | Lee et al. | |
| 2014/0332255 A1 | 11/2014 | Yoo et al. | |
| 2015/0257262 A1 | 9/2015 | Lee et al. | |
| 2016/0079149 A1 | 3/2016 | Yoshida | |

FOREIGN PATENT DOCUMENTS

| | | |
|---|---|---|
| KR | 10-0905566 B1 | 7/2009 |
| KR | 10-1148735 B1 | 5/2012 |
| KR | 10-1262486 B1 | 5/2013 |
| KR | 10-2013-0068660 A | 6/2013 |
| KR | 10-2014-0044034 A | 4/2014 |

* cited by examiner

PRINTED CIRCUIT BOARD

CROSS-REFERENCE TO RELATED APPLICATIONS

This application is the U.S. national stage application of International Patent Application No. PCT/KR2018/008582, filed Jul. 27, 2018, which claims the benefit under 35 U. S.C. § 119 of Korean Application No. 10-2017-0096521, filed Jul. 28, 2017, the disclosures of each of which are incorporated herein by reference in their entirety.

TECHNICAL FIELD

The present invention relates to a printed circuit board (PCB), and more particularly, to a PCB including a circuit pattern buried on both sides thereof and a method of manufacturing the same.

BACKGROUND ART

A printed circuit board (PCB) is a circuit board that electrically connects or mechanically fixes a certain electronic component, and is composed of a copper foil layer that is attached to an insulating layer such as phenol resin, epoxy resin, or the like to form a predetermined wiring pattern.

Such a printed circuit board is generally classified, according to a number of layers, into a single-sided printed circuit board in which a wiring is formed only on one side of an insulating layer, a double-sided printed circuit board in which the wiring is formed on both sides of the insulating layer, and a multiple layer printed circuit board in which the wiring is formed in multiple layers.

Of these, the multiple layer printed circuit board is manufactured by impregnating woven glass fiber with BT, FR-4, or other resins to produce a core, and then laminating a copper foil on both sides of the core to form an inner layer circuit, and thereafter, the substrate is manufactured using a subtractive process, a semi-additive process, or the like.

FIG. 1 is a view showing a structure of a printed circuit board according to the related art.

Referring to FIG. 1, a conventional printed circuit board 10 includes a first insulating layer 11, a first circuit pattern 12, a second insulating layer 13, a first via 14, a second via 15, a second circuit pattern 16, a third circuit pattern 17, a first passivation layer 18, and a second passivation layer 19.

In the printed circuit board 10 as described above, the first circuit pattern 12 and the third circuit pattern 17 are disposed on both surfaces of the first insulating layer 11.

In addition, the second insulating layer 13 is disposed on the first insulating layer 11. Further, the second circuit pattern 16 is disposed on an upper surface of the second insulating layer 13.

Further, the first via 14 is disposed passing through the first insulating layer 11, and accordingly, the circuit pattern 12 and the third circuit pattern 17 respectively disposed on an upper surface and a lower surface of the first insulating layer 11 are electrically connected by the first via 14.

Furthermore, the second via 15 is disposed passing through the second insulating layer 13, and accordingly, the first circuit pattern 12 and the second circuit pattern 16 respectively disposed on the upper surface of the first insulating layer 11 and the upper surface of the second insulating layer 13 are electrically connected by the second via 15.

In addition, the first passivation layer 18 is disposed on the second insulating layer 13, and accordingly, the upper surface of the second insulating layer 13 and a part of a surface of the second circuit pattern 16 are covered by the first passivation layer 18.

Further, the second passivation layer 19 is disposed under the first insulating layer 11, and accordingly, the lower surface of the first insulating layer 11 and a part of a surface of the third circuit pattern 17 are covered by the second passivation layer 19.

However, such a printed circuit board according to the related art is formed in a form in which the second circuit pattern 16 and the third circuit pattern 17 corresponding to an outer layer circuit pattern protrude on a surface of an insulating layer, and accordingly, there is a problem that a thickness of the entire printed circuit board is increased by a thickness corresponding to the outer layer circuit pattern.

In addition, since the outer layer circuit pattern is not a buried pattern in the conventional printed circuit board, there is a problem that a circuit pattern should be formed using a special resin such as a primer in order to form a fine pattern.

Further, since the outer layer circuit pattern has a protruding structure in the conventional printed circuit board, a passivation layer should be formed using a thermosetting epoxy such as a solder resist in order to protect the surface of the outer layer circuit pattern on the outermost layer of the substrate, and accordingly, there is a problem that a product unit cost is increased.

Furthermore, since the insulating layer is manufactured using a thermosetting resin having glass fibers in the conventional printed circuit board, there is a difficulty in forming a via for conducting each layer.

DISCLOSURE

Technical Problem

In an embodiment according to the present invention, there is provided a printed circuit board capable of reducing an entire thickness while being capable of forming a fine pattern, and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A printed circuit board according to an embodiment of the present invention includes: a first insulating layer; an inner layer circuit pattern disposed on an upper surface of the first insulating layer; a second insulating layer disposed on the first insulating layer and covering the inner layer circuit pattern; a plurality of first groove portions formed on a lower surface of the first insulating layer; a plurality of first outer layer circuit patterns disposed in the plurality of first groove portions; a plurality of second groove portions formed on an upper surface of the second insulating layer; and a plurality of second outer layer circuit patterns disposed in the plurality of second groove portions, wherein materials of the first insulating layer and the second insulating layer are different from each other, and any one of the first insulating layer and the second insulating layer includes glass fiber.

In addition, lower surfaces of the plurality of first outer layer circuit patterns have a step with the lower surface of the first insulating layer, upper surfaces of the plurality of second outer layer circuit patterns have a step with the upper surface of the second insulating layer, and a lower surface of the inner layer circuit pattern is disposed on the same plane as the upper surface of the first insulating layer and a lower surface of the second insulating layer.

Further, the lower surfaces of the plurality of first outer layer circuit patterns are positioned higher than the lower surface of the first insulating layer, and the upper surfaces of the plurality of second outer layer circuit patterns are positioned lower than the upper surface of the second insulating layer.

In addition, another one of the first insulating layer and the second insulating layer does not include the glass fiber.

Further, the insulating layer including the glass fiber is a thermosetting resin, and the insulating layer not including the glass fiber is a photocurable resin.

In addition, a solder resist is not disposed on the lower surface of the first insulating layer and the upper surface of the second insulating layer, and the lower surface of the first insulating layer and the upper surface of the second insulating layer are exposed to the outside.

In addition, a second via passing through the second insulating layer, and an upper surface of which is positioned lower than the upper surface of the second insulating layer is further included, and a lower surface of the second via is in contact with an upper surface of the inner layer circuit pattern.

In addition, a bottom surface of the second groove portion is positioned higher than the upper surface of the inner layer circuit pattern, and lower surfaces of the plurality of second outer layer circuit patterns are positioned higher than the upper surface of the inner layer circuit pattern.

In addition, the upper surface of the second via is positioned on the same plane as the upper surfaces of the plurality of second outer layer circuit patterns.

Further, the second via has the same shape as a vertical cross section of the plurality of second outer layer circuit patterns, and a side surface of the second via is perpendicular to the upper surface of the second insulating layer.

Furthermore, the side surface of the second via has a predetermined inclination angle with respect to the upper surface of the second insulating layer, and side surfaces of the plurality of second outer layer circuit patterns are perpendicular to the upper surface of the second insulating layer.

In addition, the printed circuit board includes: a first passivation layer disposed on the lower surface of at least one of the plurality of first outer layer circuit patterns; and a second passivation layer disposed on the upper surface of at least one of the plurality of second outer layer circuit patterns, wherein a lower surface of the first passivation layer is positioned on the same plane as the lower surface of the first insulating layer, and an upper surface of the second passivation layer is positioned on the same plane as the upper surface of the second insulating layer.

Further, the printed circuit board includes: a first passivation layer disposed on the lower surface of the first insulating layer and the lower surface of at least one of the plurality of the first outer layer circuit patterns; and a second passivation layer disposed on the upper surface of the second insulating layer and the upper surface of at least one of the plurality of second outer layer circuit patterns, wherein the first passivation layer has a step between a lower surface of a portion disposed on the lower surface of the first insulating layer and a lower surface of a portion disposed on the lower surface of the at least one first outer layer circuit pattern, and the second passivation layer has a step between an upper surface of a portion disposed on the upper surface of the second insulating layer and an upper surface of a portion disposed on the upper surface of the at least one second outer layer circuit pattern.

In addition, a printed circuit board according to an embodiment of the present invention includes: a first insulating layer; an inner layer circuit pattern disposed on an upper surface of the first insulating layer; a second insulating layer disposed on the first insulating layer and covering the inner layer circuit pattern; a plurality of first groove portions formed on a lower surface of the first insulating layer; a plurality of first outer layer circuit patterns disposed in the plurality of first groove portions; a plurality of second groove portions formed on an upper surface of the second insulating layer; and a plurality of second outer layer circuit patterns disposed in the plurality of second groove portions, wherein lower surfaces of the plurality of first outer layer circuit patterns have a step with the lower surface of the first insulating layer, upper surfaces of the plurality of second outer layer circuit patterns have a step with the upper surface of the second insulating layer, and a lower surface of the inner layer circuit pattern is disposed on the same plane as the upper surface of the first insulating layer and a lower surface of the second insulating layer.

Further, the lower surfaces of the plurality of first outer layer circuit patterns are positioned higher than the lower surface of the first insulating layer, and the upper surfaces of the plurality of second outer layer circuit patterns are positioned lower than the upper surface of the second insulating layer.

In addition, any one of the first insulating layer and the second insulating layer is a thermosetting resin including the glass fiber, and another one of the first insulating layer and the second insulating layer is a photocurable resin not including the glass fiber.

In addition, the printed circuit board includes: a first passivation layer disposed on the lower surface of at least one of the plurality of first outer layer circuit patterns; and a second passivation layer disposed on the upper surface of at least one of the plurality of second outer layer circuit patterns, wherein a lower surface of the first passivation layer is positioned on the same plane as the lower surface of the first insulating layer, and an upper surface of the second passivation layer is positioned on the same plane as the upper surface of the second insulating layer Further, the printed circuit board includes: a first passivation layer disposed on the lower surface of the first insulating layer and the lower surface of at least one of the plurality of the first outer layer circuit patterns; and a second passivation layer disposed on the upper surface of the second insulating layer and the upper surface of at least one of the plurality of second outer layer circuit patterns, wherein the first passivation layer has a step between a lower surface of a portion disposed on the lower surface of the first insulating layer and a lower surface of a portion disposed on the lower surface of the at least one first outer layer circuit pattern, and the second passivation layer has a step between an upper surface of a portion disposed on the upper surface of the second insulating layer and an upper surface of a portion disposed on the upper surface of the at least one second outer layer circuit pattern.

Advantageous Effects

According to an embodiment of the present invention, it is possible to form a fine pattern through a double-sided buried pattern structure, and thus a product unit cost may be reduced according to not using a special resin such as a primer resin.

In addition, according to the embodiment of the present invention, an entire thickness of the printed circuit board corresponding to a thickness of the outermost layer circuit pattern may be reduced by providing a double-sided buried structure in which the outermost layer circuit pattern is buried in an insulating layer.

Further, according to the embodiment of the present invention, a passivation layer such as a solder resist that protects a surface of the outermost layer circuit pattern may be removed by burying the outermost layer circuit pattern in an insulating layer. Accordingly, the entire thickness of the printed circuit board may be reduced corresponding to a thickness of the passivation layer.

MODES OF THE INVENTION

Figure 1:
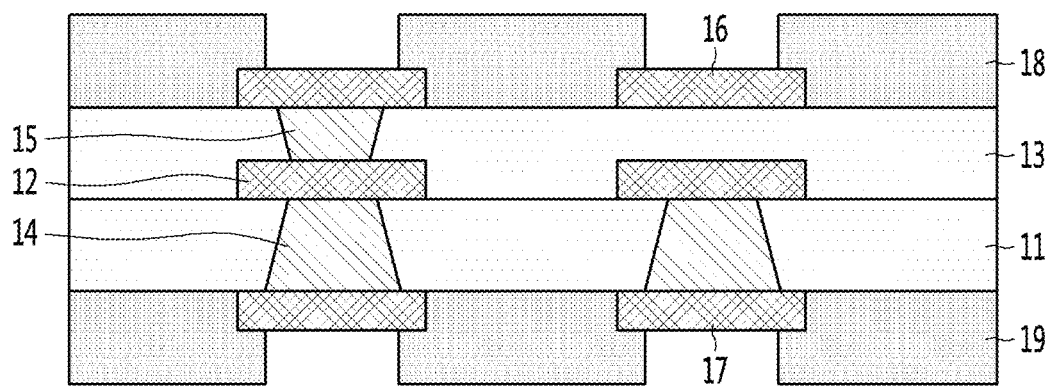
FIG. 1 is a view showing a structure of a printed circuit board according to the related art.

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

As used herein, the singular forms "a," "an" and "the" are intended to include the plural forms as well, unless the context clearly indicates otherwise.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 2:
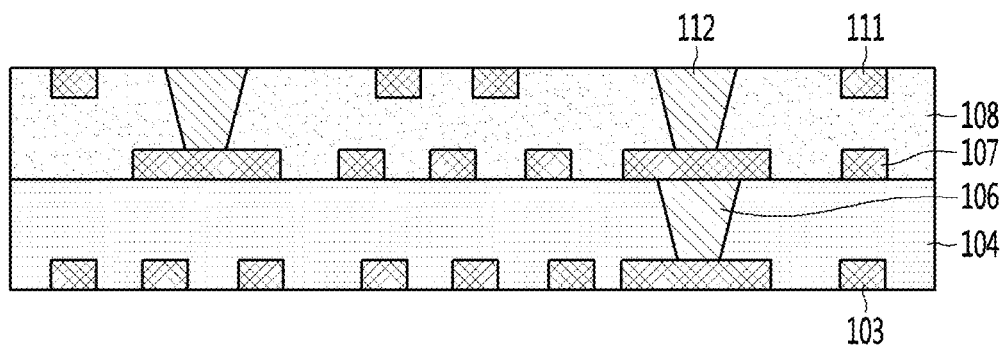
FIG. 2 is a view showing a printed circuit board according to a first embodiment of the present invention.
Figure 3:
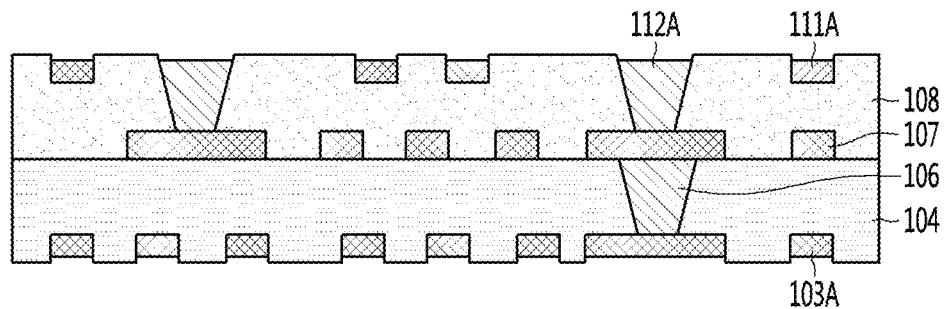
FIG. 3 is a view showing a printed circuit board according to a second embodiment of the present invention.

FIG. 2 is a view showing a printed circuit board according to a first embodiment of the present invention, and FIG. 3 is a view showing a printed circuit board according to a second embodiment of the present invention.

First, referring to FIG. 2, a printed circuit board 100 includes a first insulating layer 104, a second insulating layer 108, an inner layer circuit pattern 107, a first via 106, a second via 112, a first outer layer circuit pattern 103, and a second outer layer circuit pattern 111.

The printed circuit board 100 may represent an electrical wiring for connecting a circuit component as a wiring pattern based on a circuit design, and may reproduce an electrical conductor on an insulator. In addition, the printed circuit board 100 may mount electrical components thereon, may form a wiring connecting them in a circuit, and may mechanically fix components other than an electrical connection function of the components.

The first insulating layer 104 may be a supporting substrate of the printed circuit board 100 on which a single circuit pattern is formed, but may refer to an insulating region in which a circuit pattern of any one of the printed circuit boards 100 having a plurality of stacked structures is formed.

Preferably, in the first embodiment of the present invention, the printed circuit board 100 has a three-layer structure (3 Metal Layer), and accordingly, the printed circuit board 100 includes two insulating layers.

The second insulating layer 108 is disposed on the first insulating layer 104.

The second insulating layer 108 covers the inner layer circuit pattern 107 disposed on an upper surface of the first insulating layer 104. Preferably, the inner layer circuit pattern 107 is disposed between the first insulating layer 104 and the second insulating layer 108.

At this time, the first insulating layer 104 and the second insulating layer 108 include different materials. Preferably, the first insulating layer 104 includes a thermosetting resin, and the second insulating layer 108 includes a photocurable resin.

Preferably, the first insulating layer 104 may include an epoxy resin, glass fiber, a silicon-based filler (Si filler), and a hardener.

In addition, unlike the first insulating layer 104, the second insulating layer 108 may include an epoxy resin, a photoinitiator, a silicon-based filler (Si filler), and a hardener.

Here, in the present invention, a solder resist (SR) that should be disposed on the second insulating layer 108 in the related art may be deleted by configuring the second insulating layer 108 with the photocurable resin including the above-described materials. In addition, in the present invention, the outermost layer circuit pattern is not a protruding pattern protruding on a surface of an insulating layer, but may be formed with a buried pattern buried in the surface of the insulating layer by configuring the second insulating layer 108 with the photocurable resin. This will be described in more detail below.

The first via 106 is formed passing through the first insulating layer 104. Preferably, one end of the first via 106 is connected to the inner layer circuit pattern 107 disposed on the first insulating layer 104, and the other end is connected to the first outer layer circuit pattern 103 buried in a lower surface of the first insulating layer 104.

That is, the first via 106 is a path for interlayer electrical connection of the printed circuit board, and may be formed by forming a via hole (described later) by drilling an electrically disconnected layer, and filling with a conductive material or plating with a conductive material the formed via hole.

A metal material for forming the first via 106 may be any one material selected from Cu, Ag, Sn, Au, Ni, and Pd, and filling of the metal material may use any one of electroless plating, electrolytic plating, screen printing, sputtering, evaporation, inkjetting, and dispensing, or a method combining these.

At this time, the via hole may be formed by any one processing method of mechanical processing, laser processing, and chemical processing.

When the via hole is formed by mechanical processing, methods such as milling, drilling, routing, and the like may be used, and when the via hole is formed by laser processing, a UV or $CO_2$ laser method may be used, and when the via hole is formed by chemical processing, the substrate 110 may be opened using a chemical including aminosilane, ketones, and the like.

Meanwhile, the laser processing is a cutting method that takes a desired shape by melting and evaporating a part of a material by concentrating optical energy on a surface of the material, and may easily machine complicated formation by a computer program, and may machine complex materials that are difficult to cut by other methods.

In addition, the processing by the laser may have an advantage that a cutting diameter may be a minimum of 0.005 mm and a thickness range that may be machined is wide. As the laser processing drill, it is preferable to use an yttrium aluminum garnet (YAG) laser, a $CO_2$ laser, or an ultraviolet (UV) laser. The YAG laser is a laser that may machine both a copper foil layer and an insulating layer, and the $CO_2$ laser is a laser that may machine only the insulating layer.

Further, the second via 112 is formed passing through the second insulating layer 108. Preferably, one end of the second via 112 is connected to the inner layer circuit pattern 107, and the other end is exposed on an upper surface of the second insulating layer 108.

Furthermore, the first outer layer circuit pattern 103 is formed to be buried in the lower surface of the first insulating layer 104, and the second outer layer circuit pattern 111 is formed to be buried in the upper surface of the second insulating layer 108.

In other words, a lower surface of the first outer layer circuit pattern 103 in the first embodiment of the present invention is disposed on the same plane as the lower surface of the first insulating layer 104. Also, an upper surface of the second outer layer circuit pattern 111 is disposed on the same plane as the upper surface of the second insulating layer 108.

The inner layer circuit pattern 107, the first outer layer circuit pattern 103, and the second outer layer circuit pattern 111 may be formed of conductive metal materials such as copper (Cu), iron (Fe), and alloys thereof.

As described above, the printed circuit board 100 in the first embodiment of the present invention forms an outer layer circuit pattern with a fine pattern through the buried pattern structure on surfaces of the first insulating layer 104 and the second insulating layer 108. At this time, formation of a buried structure while forming the outer layer circuit pattern in a fine pattern may be achieved by forming the second insulating layer 108 with a photocurable resin instead of an existing thermosetting resin.

That is, conventionally, the first insulating layer 104 and the second insulating layer 108 are composed of the same insulating layer. Preferably, conventionally, both the first insulating layer 104 and the second insulating layer 108 are formed of a photocurable resin. Accordingly, conventionally, in order to form a double-sided buried pattern, a groove using a laser is formed on the surface of the thermosetting resin, and accordingly, the groove is filled with a metal material to form a metal layer, and a polishing process for removing a part of the formed metal layer is performed. In addition, conventionally, an additional laser process has been performed separately from a buried circuit pattern for via holes different from the buried circuit pattern, and accordingly, the buried circuit pattern and the via are formed through a separate process, respectively.

However, in the present invention, a pattern groove and a via hole for forming the buried circuit pattern are simultaneously formed, and accordingly, a plating process for filling the pattern groove and the via hole is performed at a time.

Conventionally, since the second insulating layer 108 includes a thermosetting resin, the pattern groove and the via hole may be formed only through the laser, and accordingly, a laser process suitable for each depth should be performed separately.

However, in the present invention, since the second insulating layer 108 includes a photocurable resin, the pattern groove and the via hole are formed by performing exposure and development processes instead of the conventional laser process, so that it is easy to select a precise position and control a size (width and depth) of the pattern groove as compared with the laser process.

Meanwhile, in the first embodiment of the present invention, the first outer layer circuit pattern 103 and the second outer layer circuit pattern 111 are positioned on the same plane as the lower surface of the first insulating layer 104 and the upper surface of the second insulating layer 108, respectively.

Otherwise, referring to FIG. 3, a first outer layer circuit pattern 103A and the second outer layer circuit pattern 111 may be positioned on a different plane from the surfaces of the first insulating layer 104 and the second insulating layer 108.

Preferably, the first outer layer circuit pattern 103A in the second embodiment of the present invention is positioned higher than the lower surface of the first insulating layer 104. In other words, the first outer layer circuit pattern 103A is buried under the first insulating layer 104. At this time, a lower surface of the first outer layer circuit pattern 103A is positioned higher than the lower surface of the first insulating layer 104.

The second outer layer circuit pattern 111A is positioned lower than the upper surface of the second insulating layer 108. In other words, the second outer layer circuit pattern 111A is formed by burying a pattern groove (described later) formed over the second insulating layer 108 to be described later. At this time, the second outer layer circuit pattern 111A is not formed by burying the entire pattern groove, but may be formed by burying only a part of the pattern groove. Therefore, the part of the pattern groove is buried with the second outer layer circuit pattern 111A, and the remaining part is maintained in an empty state.

Therefore, an upper surface of the second outer layer circuit pattern 111A is positioned lower than the upper surface of the second insulating layer 108.

In other words, in the second embodiment of the present invention, a recess is formed between a surface of the outer layer circuit pattern and a surface of the insulating layer so as to minimize a solder bridge phenomenon that may occur later. Here, the solder bridge phenomenon means a phenomenon in which solders disposed on the surface of adjacent outer layer circuit patterns are interconnected, which may greatly affect reliability of the printed circuit board.

Therefore, in the present invention, a recess is formed between the outer layer circuit pattern and the surface of the insulating layer through a step as described above to minimize possibility of occurrence of the solder bridge as described above.

In addition, in the present invention, since the second insulating layer 108 includes a photocurable resin such as an existing solder resist as described above, and the recess is formed as described above, an additional passivation layer (for example, solder resist) for protecting the outer layer circuit pattern may not be formed on the surface of the first insulating layer 104 and the surface of the second insulating layer 108.

That is, conventionally, the second insulating layer 108 is formed of a material such as prepreg, and since a surface roughness of the prepreg may cause a problem in mold fluidity, and the like, an additional passivation layer as described above should be formed.

However, in the present invention, the second insulating layer 108 is formed of a photocurable resin having physical properties similar to those of the solder resist, and accordingly, the solder resist may be eliminated by forming a recess through the step with the surface of the outer layer circuit pattern, and further, the solder bridge phenomenon may be improved, the mold fluidity may be improved, and a bonding problem may be solved.

Hereinafter, a method of manufacturing the printed circuit board 100 according to the first embodiment of the present invention will be described.

FIGS. 4 to 12 are views showing a method of manufacturing the printed circuit board 100 according to the first embodiment of the present invention in the order of processes.

Figure 4:
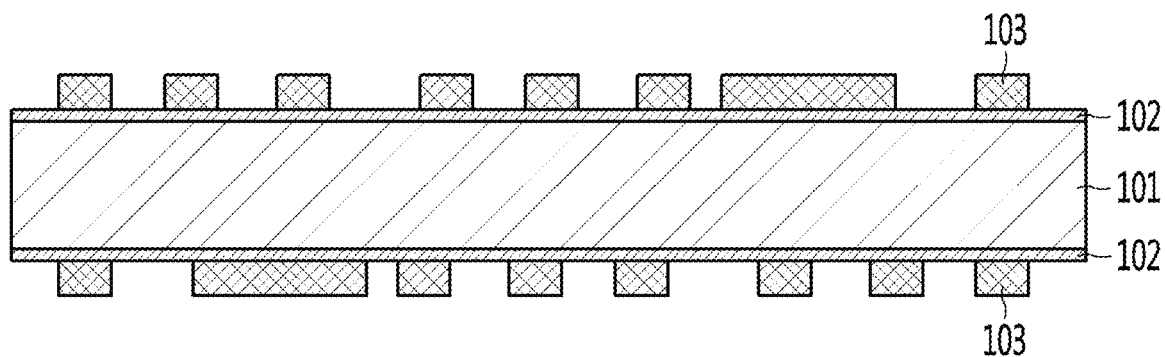
FIGS. 4 to 12 are views showing a method of manufacturing a printed circuit board 100 according to the first embodiment of the present invention in the order of processes.

First, referring to FIG. 4, a carrier 101 is prepared, and a copper foil layer 102 is formed on both sides of the carrier 101. That is, in the present invention, separate printed circuit boards 100 are manufactured at upper and lower portions of the carrier 101 around the carrier 101, respectively. That is, in the present invention, a plurality of printed circuit boards 100 are simultaneously manufactured using one carrier. However, it is merely one embodiment of the present invention, and a manufacturing process of a printed circuit board may be performed only at the upper portion or lower portion around the carrier.

Meanwhile, the copper foil layer 102 may be formed on the carrier 101 by electroless plating a metal including copper.

In addition, the copper foil layer 102 may use a general CCL (Copper Clad Laminate) unlike a case in which the copper foil layer 102 is formed on a surface of the carrier 101 by electroless plating. In this case, when electroless plating the copper foil layer 102, it is possible to perform electroless plating by proceeding in the order of a degreasing process, a soft corrosion process, a pre-catalytic treatment process, a catalytic treatment process, an activation process, an electroless plating process, and an antioxidation process.

Further, the copper foil layer 102 may be formed by sputtering metal particles on the surface of the carrier 101 using plasma instead of plating.

Next, a first outer layer circuit pattern 103 is formed on the copper foil layer 102. The first outer layer circuit pattern 103 may be formed by an additive process, a subtractive process, a modified semi additive process (MSAP), a semi additive process (SAP), and the like, which are manufacturing processes of a general printed circuit board, and detailed description is omitted here.

Figure 5:
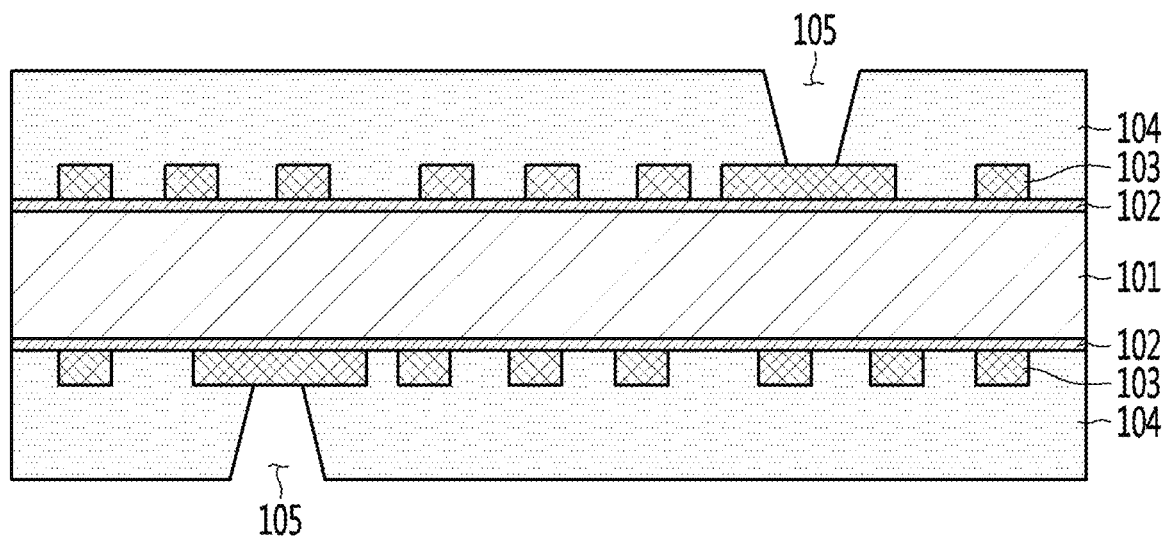

Next, referring to FIG. 5, a first insulating layer 104 is formed on the copper foil layer 102 on which the first outer layer circuit pattern 103 is formed.

At this time, the first insulating layer 104 may include a thermosetting resin. Preferably, the first insulating layer 104 may include an epoxy resin, glass fiber, a silicon-based filler (Si filler), and a hardener.

Thereafter, when the first insulating layer 104 is formed, a first via hole 105 is formed in the first insulating layer 104. The first via hole 105 may be formed by any one processing method of mechanical processing, laser processing, and chemical processing.

When the via hole 105 is formed by mechanical processing, methods such as milling, drilling, routing, and the like may be used, and when the via hole 105 is formed by laser processing, a UV or $CO_2$ laser method may be used, and when the via hole 105 is formed by chemical processing, the first insulating layer 104 may be opened using a chemical including aminosilane, ketones, and the like.

Meanwhile, the laser processing is a cutting method that takes a desired shape by melting and evaporating a part of a material by concentrating optical energy on a surface of the material, and may easily machine complicated formation by a computer program, and may machine complex materials that are difficult to cut by other methods.

In addition, the processing by the laser may have an advantage that a cutting diameter may be a minimum of 0.005 mm and a thickness range that may be machined is wide.

As the laser processing drill, it is preferable to use an yttrium aluminum garnet (YAG) laser, a $CO_2$ laser, or an ultraviolet (UV) laser. The YAG laser is a laser that may machine both a copper foil layer and an insulating layer, and the $CO_2$ laser is a laser that may machine only the insulating layer.

Meanwhile, when the first via hole 105 is formed, a deburring process or desmear process for removing a drill burr or smear generated by drilling may be perform in order to reduce a plating defect rate of the first via hole 105.

At this time, a shape of the first via hole 105 may include not only a blind via hole clogged on one side, but also a plated through-hole passing through upper and lower surfaces of the first insulating layer 104. In addition, when the first via hole 105 is not necessary, this process may be omitted.

Figure 6:
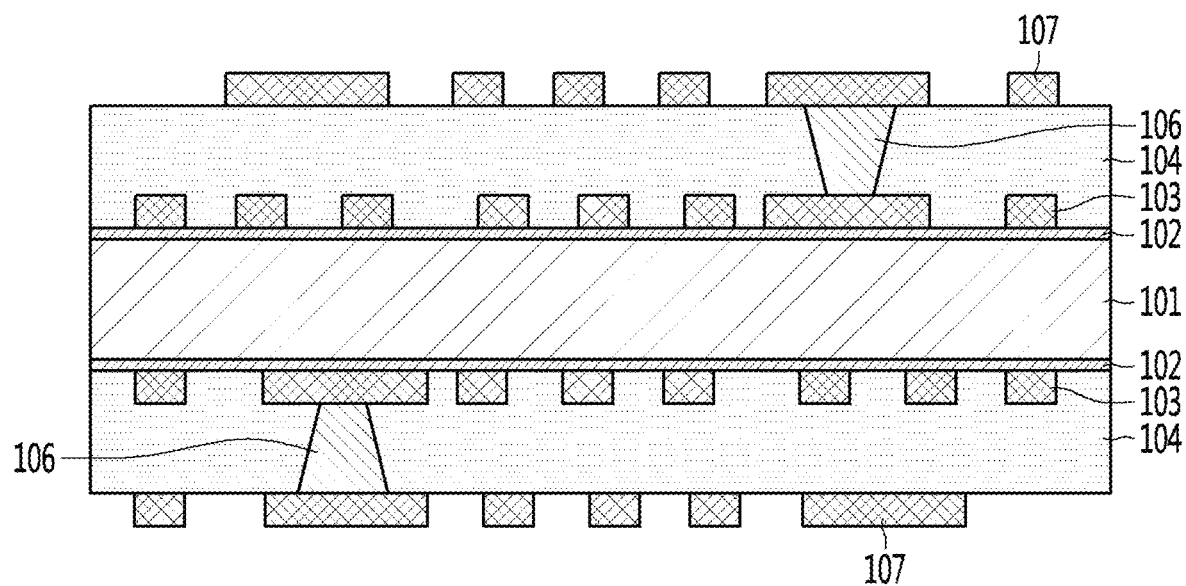

Next, referring to FIG. 6, a first via 106 is formed in the first via hole 105 of the first insulating layer 104, and an inner circuit pattern 107 is formed on the upper surface of the first insulating layer 104.

The first via 106 may be formed by filling with a conductive material or plating with a conductive material the inside of the first via hole 105.

A metal material for forming the first via 106 may be any one material selected from Cu, Ag, Sn, Au, Ni, and Pd, and filling of the metal material may use any one of electroless plating, electrolytic plating, screen printing, sputtering, evaporation, inkjetting, and dispensing, or a method combining these.

In addition, the inner layer circuit pattern 107 may be formed by an additive process, a subtractive process, a modified semi additive process (MSAP), a semi additive process (SAP), and the like, which are manufacturing processes of a general printed circuit board, and detailed description is omitted here.

Figure 7:
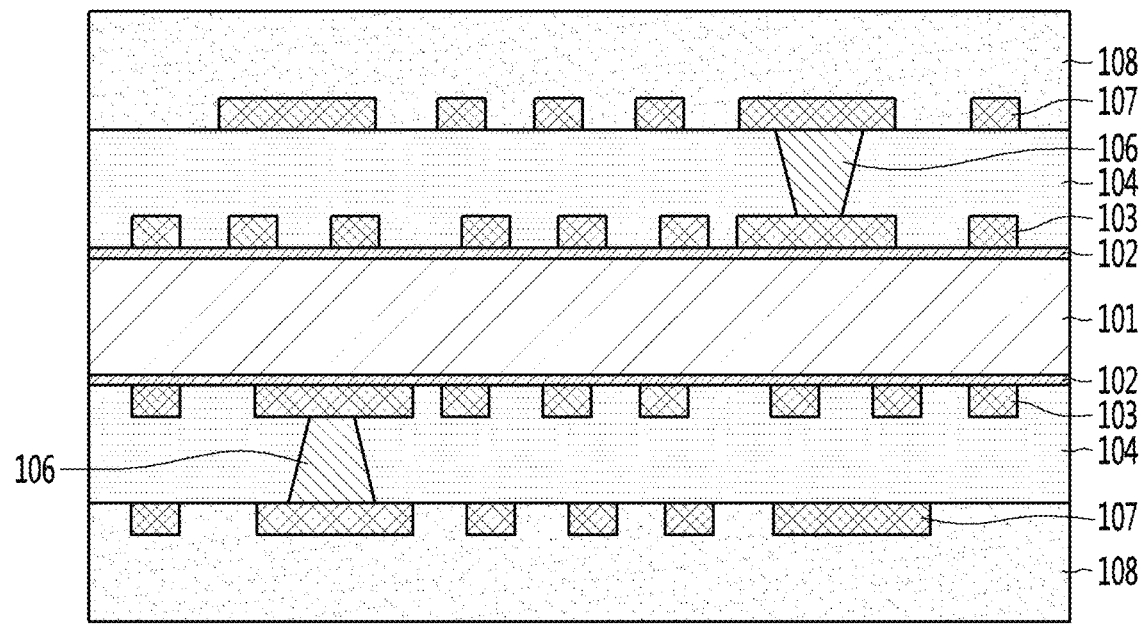

Next, referring to FIG. 7, a second insulating layer 108 is formed on the first insulating layer 104. At this time, the second insulating layer 108 includes a material different from that of the first insulating layer 104.

Preferably, the second insulating layer 108 includes a photocurable resin instead of a thermosetting resin as in the first insulating layer 104.

Accordingly, unlike the first insulating layer 104, the second insulating layer 108 may include an epoxy resin, a photoinitiator, a silicon-based filler (Si filler), and a hardener.

That is, in the present invention, the second insulating layer 108 is formed with a photocurable resin as described above so that a pattern groove and a via hole for forming a buried circuit pattern and a via may be formed through exposure and development processes. In addition, in the present invention, in order to remove a passivation layer such as a solder resist disposed on the outermost side of the printed circuit board 100, the second insulating layer 108 is formed with a photocurable resin having physical properties similar to those of the solder resist.

Figure 8:
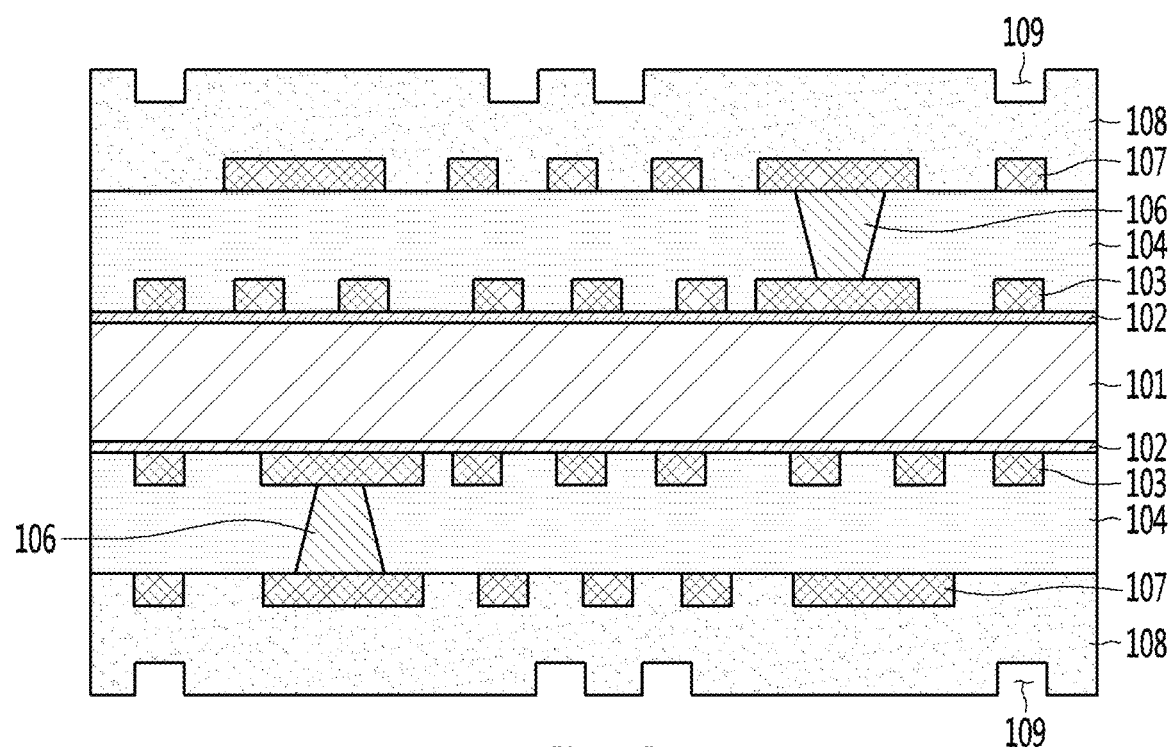

Next, referring to FIG. 8, a pattern groove 109 is formed on a surface of the second insulating layer 108. The pattern groove 109 is formed at a position in which a second outer layer circuit pattern 111 is formed in the surface of the second insulating layer 108. At this time, the pattern groove 109 may be formed through exposure and development processes.

Preferably, in order to form the pattern groove 109, preferentially, photosensitive layer curing (exposure) is performed by ultraviolet irradiation in a remaining region excluding a position in which the second outer layer circuit pattern 111 is formed in the surface of the second insulating layer 108. And then, the pattern groove 109 is formed through a photosensitive layer removal (development) process in an uncured region excluding the cured region. At this time, a depth of the pattern groove 109 may be adjusted by adjusting the exposure and development processes.

Figure 9:
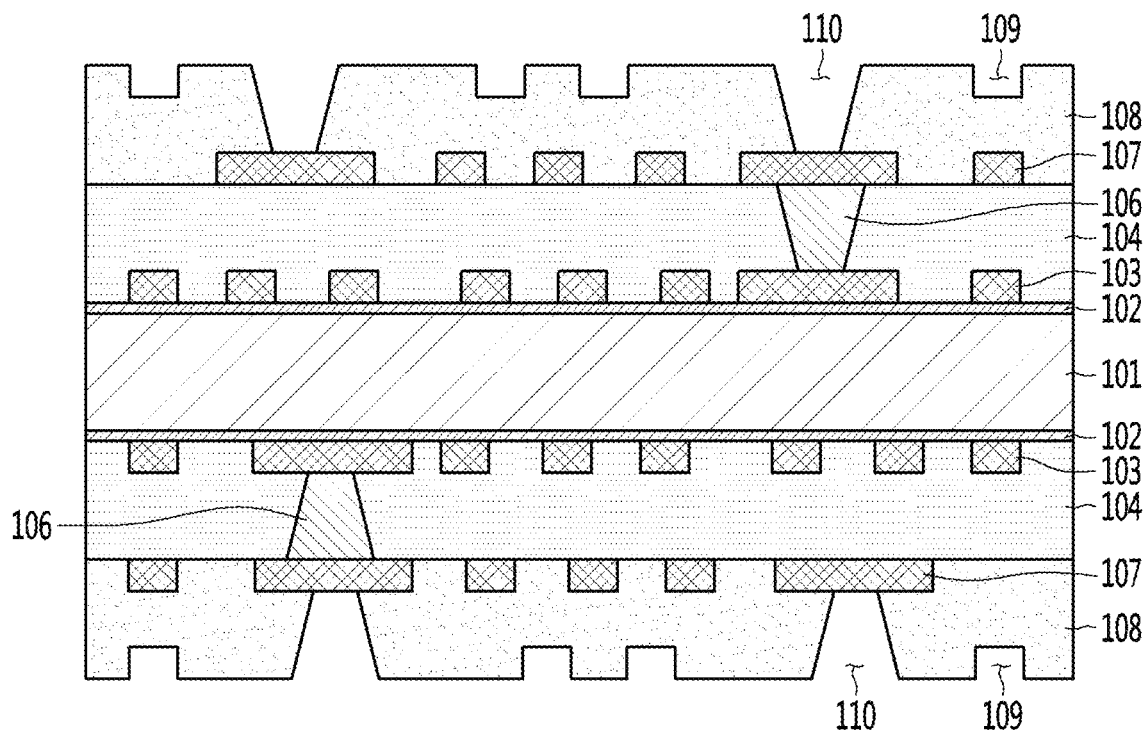

Next, referring to FIG. 9, a second via hole 110 is formed in a region in which a second via 112 is formed in the surface of the second insulating layer 108. As described above, the second via hole 110 may proceed through a laser process.

That is, in the first embodiment of the present invention, the pattern groove 109 and the second via hole 110 may be formed by applying different methods. Accordingly, the pattern groove 109 may have a quadrangular shape in a vertical cross section. Further, the second via hole 110 may have a trapezoidal shape in a vertical cross section.

Figure 10:
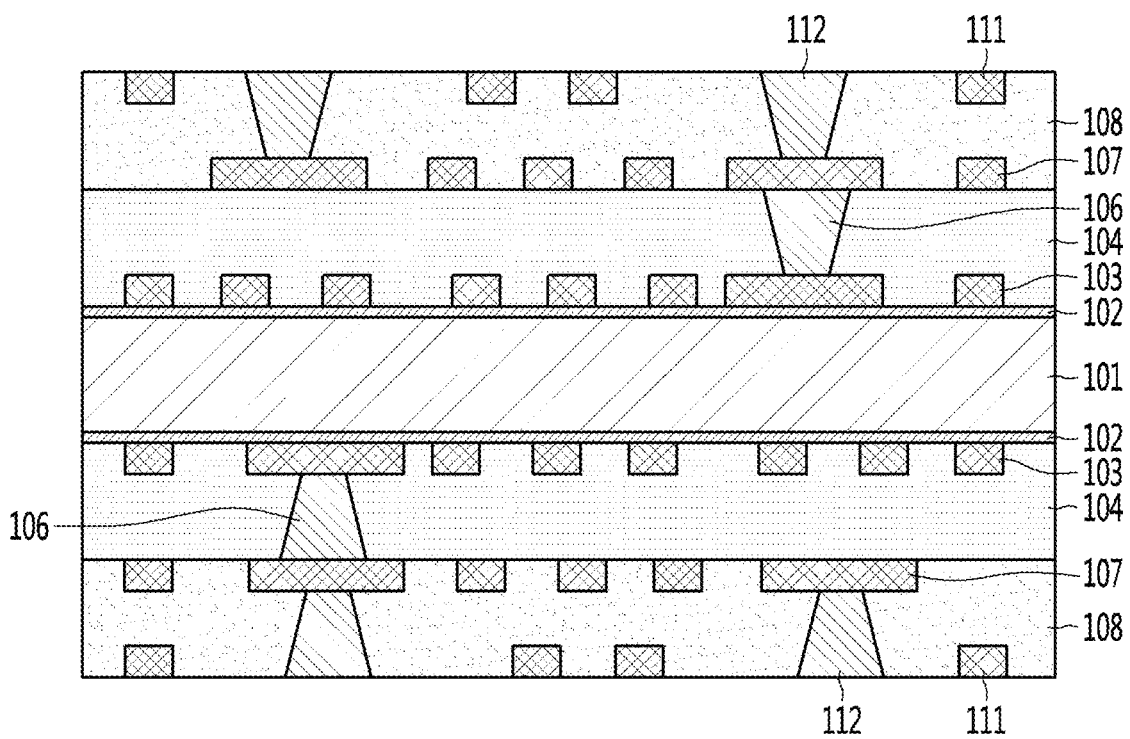

Next, referring to FIG. 10, a metal material is filled in the pattern groove 109 to form a second outer layer circuit pattern 103. Further, a metal material is filled in the second via hole 110 to form a second via 106.

Figure 11:
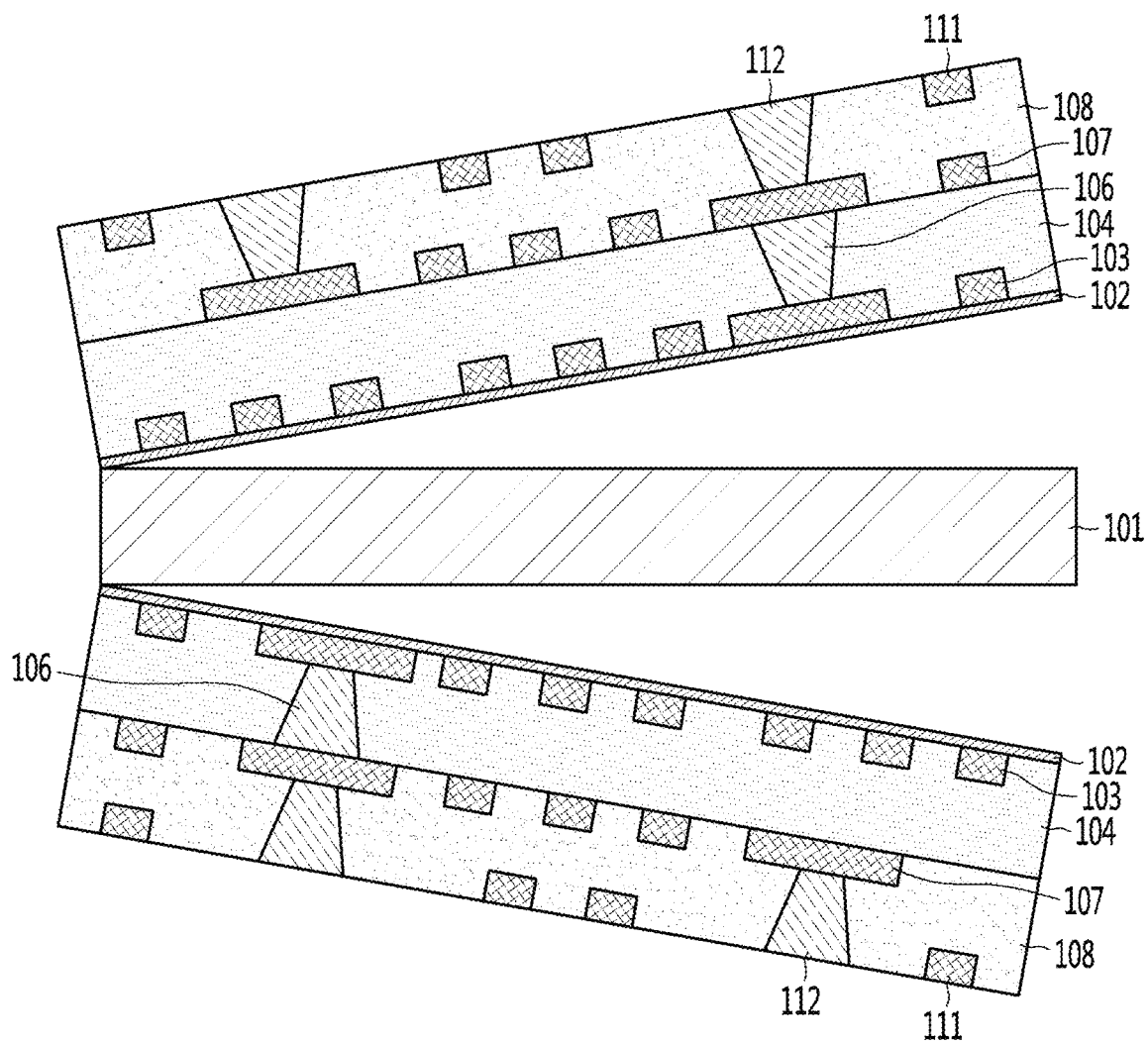

Next, referring to FIG. 11, a first printed circuit board formed at an upper portion around the carrier 101 and a second printed circuit board formed at a lower portion around the carrier 101 are separated from each other.

Figure 12:
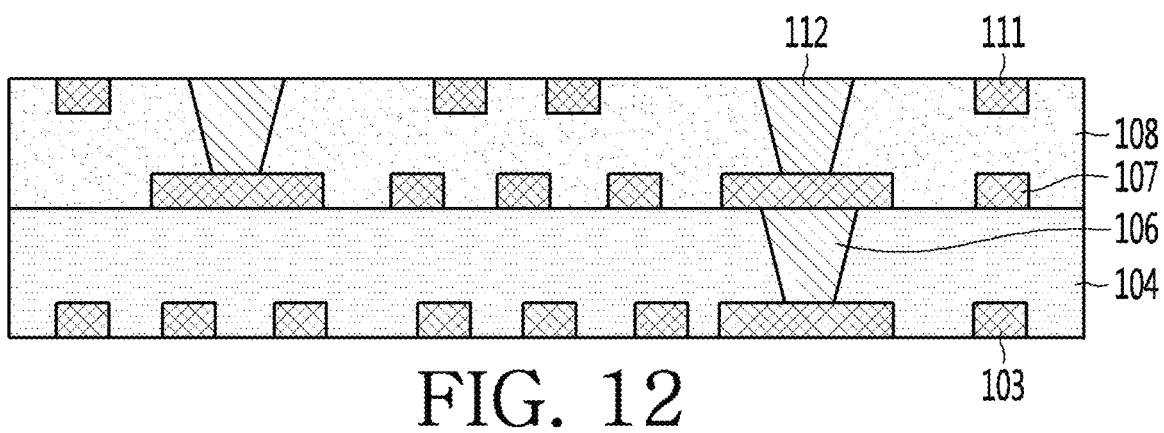

Next, referring to FIG. 12, in the printed circuit boards separated from each other, the copper foil layer 102 is removed through a flash etching process so that the lower surface of the first insulating layer 104 and the lower surface of the first outer layer circuit pattern 103 are exposed.

Figure 13:
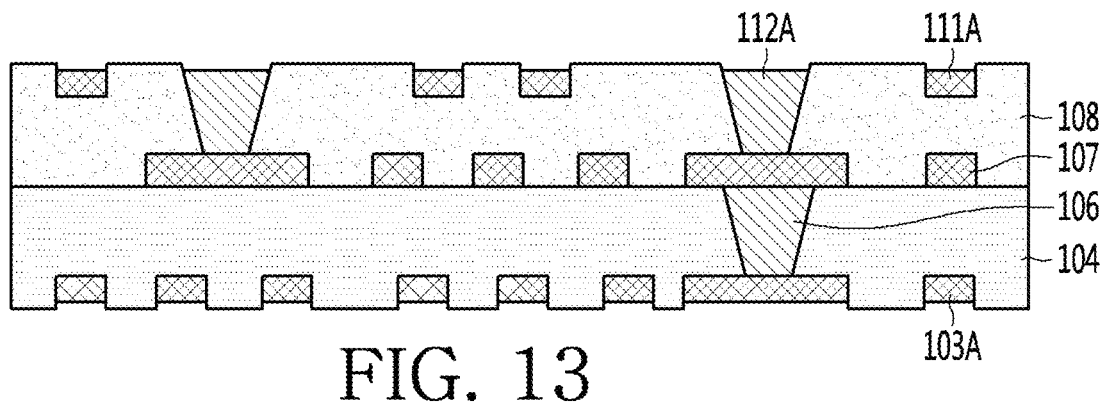
FIG. 13 is a view showing a manufacturing process of the printed circuit board according to the second embodiment of the present invention.

Meanwhile, FIG. 13 is a view showing a manufacturing process of the printed circuit board according to the second embodiment of the present invention.

Referring to FIG. 13, in a process of forming a metal material in the pattern groove 109 and the second via hole 110 in the process illustrated in FIG. 10, a second outer layer circuit pattern 111A is formed so as to bury only a part of the pattern groove 109 without burying the entire pattern groove 109.

In addition, a second via 112A is not formed by burying the entire second via hole 110, but is formed by burying only a part of the second via hole 110.

Therefore, the upper surface of the second outer layer circuit pattern 111A and the upper surface of the second via 112A are positioned not on the same plane as the upper surface of the second insulating layer 108, but lower than the upper surface of the second insulating layer 108. In other words, the surface of the second outer layer circuit pattern 111A includes a recess region (not shown) recessed inside the upper surface of the second insulating layer 108.

In addition, in the process of FIG. 12, when the flash etching process is performed, the copper foil layer 102 is not removed up to the lower surface of the first insulating layer 104, but the copper foil layer 102 and a part of a lower portion of the first outer layer circuit pattern 103 buried in a lower portion of the first insulating layer 104 are removed together.

Therefore, the lower surface of the first outer layer circuit pattern 103 is positioned not on the same plane as the lower surface of the first insulating layer 104 but higher than the lower surface of the first insulating layer 104. In other words, the surface of the first outer layer circuit pattern 103A includes a recess region (not shown) recessed inside the lower surface of the first insulating layer 104.

In the present invention, a recess is formed between the outer layer circuit pattern and the surface of the insulating layer through a step as described above to minimize possibility of occurrence of the solder bridge as described above.

In addition, in the present invention, since the second insulating layer 108 includes a photocurable resin such as an existing solder resist as described above, and the recess is formed as described above, an additional passivation layer (for example, solder resist) for protecting the outer layer circuit pattern may not be formed on the surface of the first insulating layer 104 and the surface of the second insulating layer 108.

That is, conventionally, the second insulating layer 108 is formed of a material such as prepreg, and since a surface roughness of the prepreg may cause a problem in mold fluidity, and the like, an additional passivation layer as described above should be formed.

However, in the present invention, the second insulating layer 108 is formed of a photocurable resin having physical properties similar to those of the solder resist, and accordingly, the solder resist may be eliminated by forming a recess through the step with the surface of the outer layer circuit pattern, and further, the solder bridge phenomenon may be improved, the mold fluidity may be improved, and a bonding problem may be solved.

Figure 14:
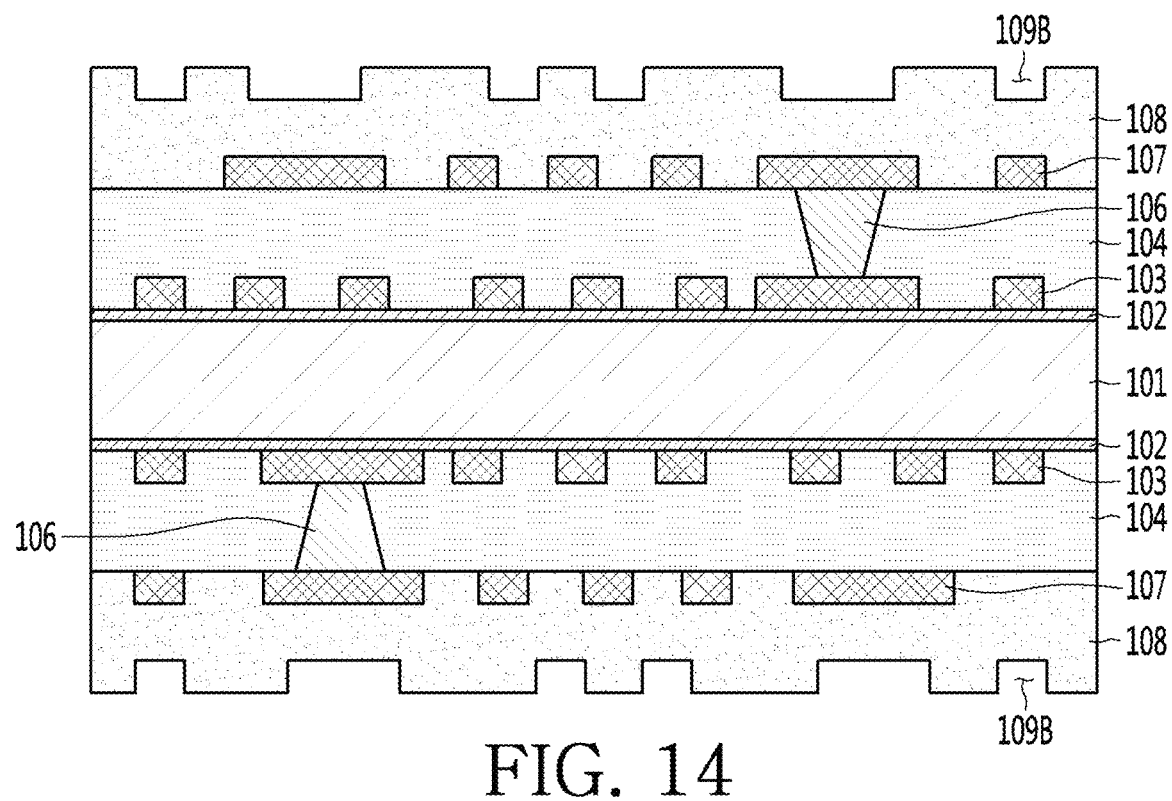
FIGS. 14 to 16 show a method of manufacturing a printed circuit board according to a third embodiment of the present invention in the order of processes.
Figure 15:
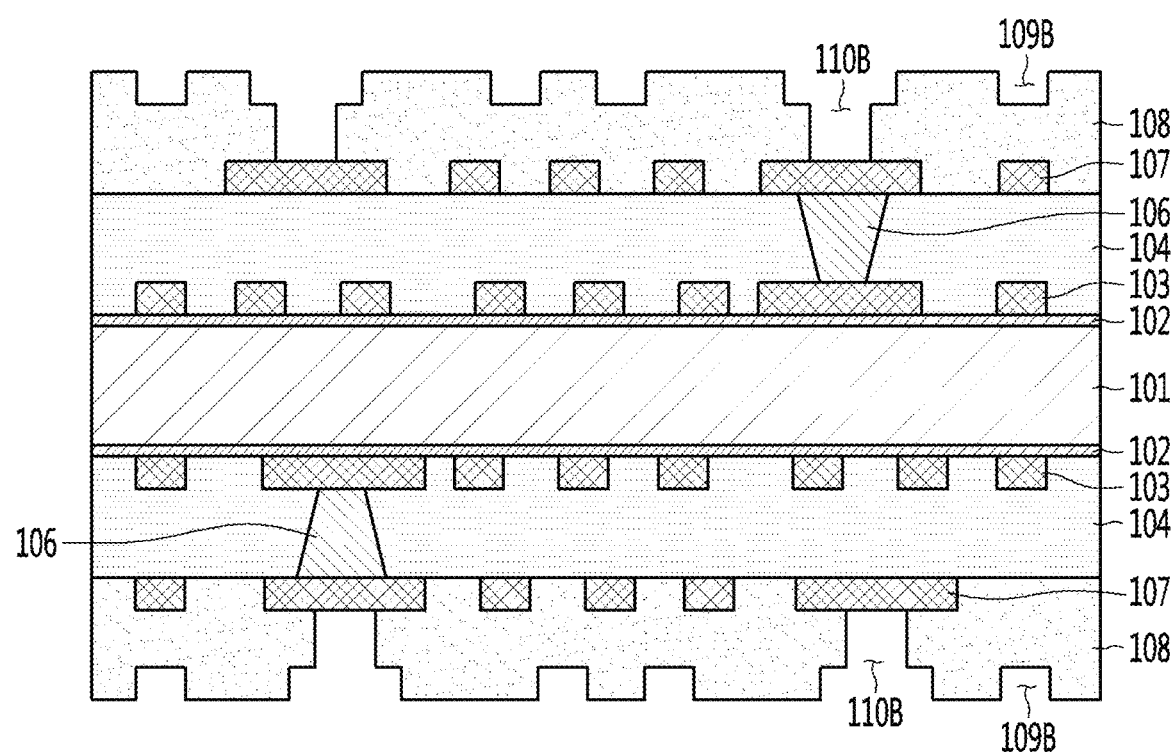
Figure 16:
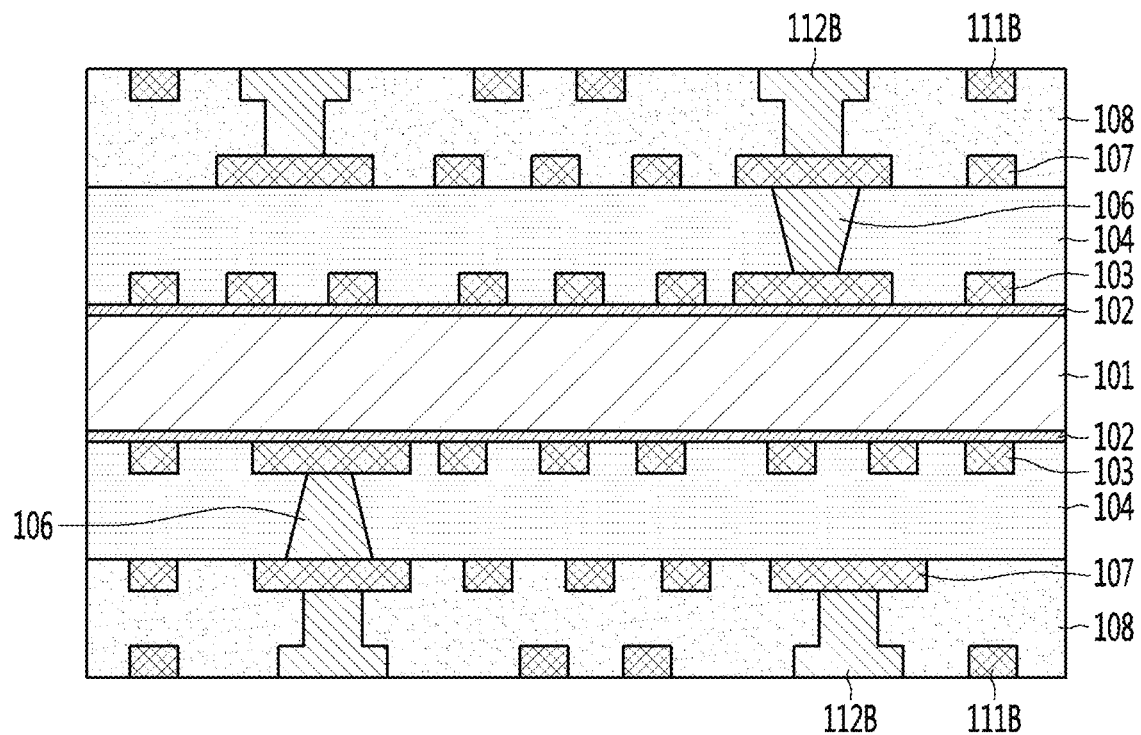

FIGS. 14 to 16 show a method of manufacturing a printed circuit board according to a third embodiment of the present invention in the order of processes.

The manufacturing method according to the third embodiment of the present invention is different only in a process of forming the second via hole, and the other processes are the same as compared with the manufacturing method according to the first embodiment. Therefore, the process of forming the second via hole in the manufacturing method according to the third embodiment of the present invention will be specifically described.

Referring to FIG. 14, a pattern groove 109B is formed on the upper surface of the second insulating layer 108. At this time, in FIG. 10, the pattern groove 109 is formed only at a position in which the second outer layer circuit pattern 111 is formed. However, in the third embodiment of the present invention, not only the pattern groove but also a second via hole in which a second via 112 is formed is formed together with the pattern groove through the exposure and development processes as described above.

Accordingly, the pattern groove 109B includes a first pattern groove disposed in a region in which a second outer layer circuit pattern procedure 111B is formed, and a second pattern groove disposed in a region in which the second via 112B is formed.

At this time, the first pattern groove and the second pattern groove may be formed at the same depth.

Accordingly, the second pattern groove is formed not to pass through the second insulating layer 108 but to open only a part of an upper portion of the second insulating layer 108.

Next, referring to FIG. 15, a third pattern groove is additionally formed in a region corresponding to the second pattern groove among the formed pattern grooves. At this time, the third pattern groove exposes an upper surface of the inner layer circuit pattern 107 disposed on the first insulating layer 104. In other words, the second via hole 110B includes the second pattern groove and the third pattern groove formed through the exposure and development processes. Accordingly, a combination of the second pattern groove and the third pattern groove forms a via hole, thereby passing through the second insulating layer 108.

Next, referring to FIG. 16, the second outer layer circuit pattern 111B and the second via 112B are formed by filling and plating a metal material in the first pattern groove, the second pattern groove, and the third pattern groove. At this time, unlike the first and second embodiments, a side surface of the second via 112B does not have a predetermined inclination angle with respect to the upper surface of the second insulating layer 108, but is disposed perpendicular to the upper surface of the second insulating layer 108.

Figure 17:
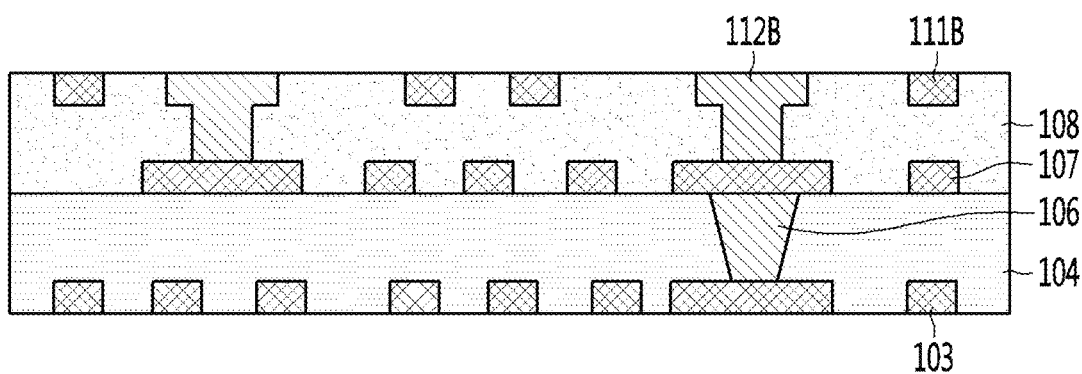
FIGS. 17 to 18 show a method of manufacturing a printed circuit board according to fourth and fifth embodiments of the present invention in the order of processes.

Next, referring to FIG. 17, a plurality of printed circuit boards respectively formed on the upper portion and the lower portion around the carrier 101 are separated from each other, and accordingly, the copper foil layer 102 disposed the lower surface of the first insulating layer 104 is removed.

Figure 18:
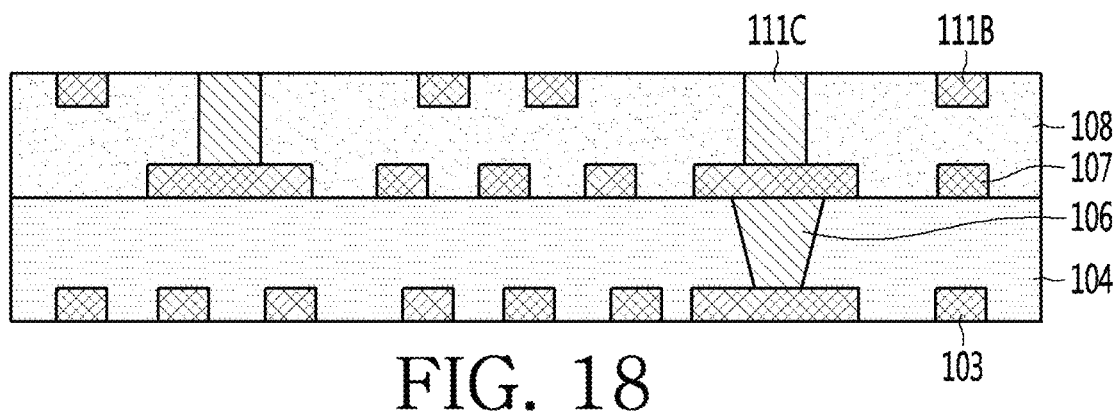

Meanwhile, as shown in FIG. 18, in the present invention, although it has been described that the second via hole includes the second pattern groove and the third pattern groove, the second via hole may include only one pattern groove.

In other words, the second via hole may be formed such that one pattern groove passes through the second insulating layer 108 by adjusting exposure and development time.

Therefore, the second via illustrated in FIG. 17 has a layered structure, but a second via 111C illustrated in FIG. 18 has a square pole shape.

Figure 19:
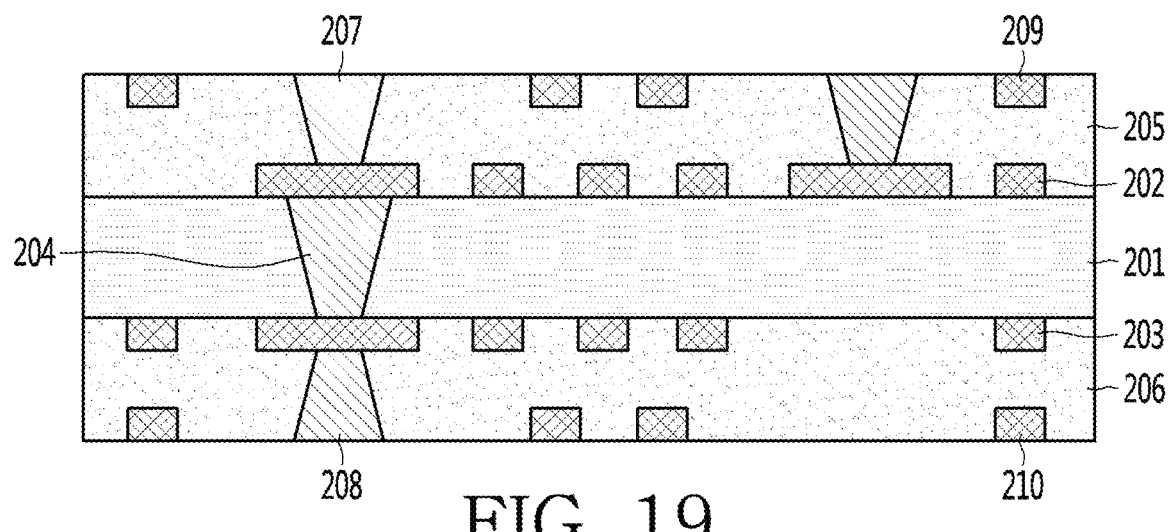
FIG. 19 shows a structure of the printed circuit board according to the third embodiment of the present invention.

FIG. 19 shows a structure of a printed circuit board according to a third embodiment of the present invention.

In the first and second embodiments of the present invention, a wiring layer of the printed circuit board has a three-layer structure (3 Metal Layer).

On the other hand, a printed circuit board 200 according to the third embodiment of the present invention has a four-layer structure (4 Metal Layer).

Accordingly, the printed circuit board 200 according to the third embodiment of the present invention includes a first insulating layer 201, a first inner layer circuit pattern 202, a second inner layer circuit pattern 203, a first via 205, a second insulating layer 205, a third insulating layer 206, a second via 207, a third via 208, a first outer layer circuit pattern 209, and a second outer layer circuit pattern 210.

The first insulating layer 201 may be a supporting substrate of the printed circuit board 200 on which a single circuit pattern is formed, but may refer to an insulating region in which a circuit pattern of any one of the printed circuit boards 200 having a plurality of stacked structures is formed.

Preferably, in the third embodiment of the present invention, the printed circuit board 100 has a four-layer structure (4 Metal Layer), and accordingly, the printed circuit board 300 includes three insulating layers.

The second insulating layer 205 is disposed on the first insulating layer 201, and the third insulating layer 206 is disposed under the first insulating layer 201.

The second insulating layer 205 covers the first inner layer circuit pattern 202 disposed on an upper surface of the first insulating layer 201. Preferably, the first inner layer circuit pattern 202 is disposed between the first insulating layer 201 and the second insulating layer 205.

The third insulating layer 206 covers the second inner layer circuit pattern 203 disposed under a lower surface of the first insulating layer 201. Preferably, the second inner layer circuit pattern 203 is disposed between the first insulating layer 201 and the third insulating layer 206.

At this time, the first insulating layer 201 includes a different material from the second insulating layer 205 and the third insulating layer 206. Preferably, the first insulating layer 201 includes a thermosetting resin, and the second insulating layer 205 and the third insulating layer 206 include a photocurable resin.

Preferably, the first insulating layer 201 may include an epoxy resin, glass fiber, a silicon-based filler (Si filler), and a hardener.

In addition, unlike the first insulating layer 201, the second insulating layer 205 and the third insulating layer 206 may include an epoxy resin, a photoinitiator, a silicon-based filler (Si filler), and a hardener.

Here, in the present invention, a solder resist (SR) that should be disposed on an upper surface of the second insulating layer 205 and a lower surface of the third insulating layer 206 in the related art may be deleted by configuring the second insulating layer 205 and the third insulating layer 206 with a photocurable resin including the above-described materials. In addition, in the present invention, the outermost layer circuit pattern is not a protruding pattern protruding on a surface of an insulating layer, but may be formed with a buried pattern buried in the surface of the insulating layer by configuring the second insulating layer and the third insulating layer with the photocurable resin.

The first via 204 is formed passing through the first insulating layer 201. Preferably, one end of the first via 204 is connected to the first inner layer circuit pattern 202 disposed on the first insulating layer 201, and the other end is connected to the second inner layer circuit pattern 203 disposed under the first insulating layer 201.

In addition, the second via 207 is formed passing through the second insulating layer 205. Preferably, one end of the second via 207 is connected to the first inner layer circuit pattern 202, and the other end is exposed on an upper surface of the second insulating layer 205. Preferably, an upper region of the second via 205 may include the first outer layer circuit pattern 209, so that the second via 207 electrically connects to the first inner layer circuit pattern 202 and the first outer layer circuit pattern 209.

The third via 208 is formed passing through the third insulating layer 208. Preferably, one end of the third via 208 is connected to the second inner layer circuit pattern 203 and the other end is exposed below a lower surface of the third insulating layer 206. Preferably, a lower region of the third via 208 may include the second outer layer circuit pattern 210, so that the third via 208 electrically connects to the second inner layer circuit pattern 203 and the second outer layer circuit pattern 210.

As described above, in the third embodiment of the present invention, the printed circuit board 200 forms the outer layer circuit pattern buried in the upper surface of the second insulating layer 205 and the lower surface of the third insulating layer 206. At this time, having a buried structure while forming the outer layer circuit pattern in a fine pattern may be achieved by forming the second insulating layer and the third insulating layer with a photocurable resin instead of a conventional thermosetting resin.

Figure 20:
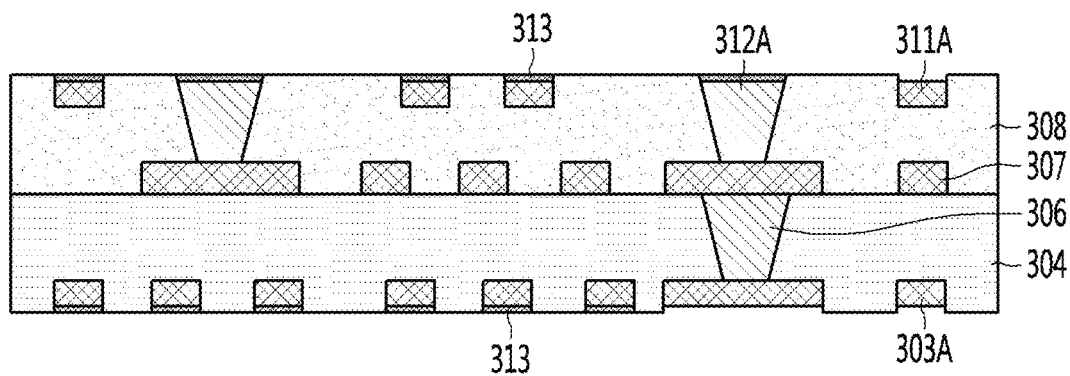
FIG. 20 shows a structure of the printed circuit board according to the fourth embodiment of the present invention.

FIG. 20 shows a structure of a printed circuit board according to a fourth embodiment of the present invention.

Referring to FIG. 20, the printed circuit board includes a first insulating layer 304, a second insulating layer 308, an inner layer circuit pattern 307, a first via 306, a second via 312A, a first outer layer circuit pattern 303A, a second outer layer circuit pattern 311A, and a passivation layer 313.

The printed circuit board according to the fourth embodiment illustrated in FIG. 20 has substantially the same structure as the remaining configuration of the printed circuit board illustrated in FIG. 3 except for the passivation layer 313.

Therefore, hereinafter, in the printed circuit board according to the fourth embodiment of the present invention, only a structure of the passivation layer 313 will be described.

The first outer layer circuit pattern 303A and the second outer layer circuit pattern 311A may be positioned on a different plane from surfaces of the first insulating layer 304 and the second insulating layer 308.

Preferably, the first outer layer circuit pattern 303A in the fourth embodiment of the present invention is positioned higher than a lower surface of the first insulating layer 304. In other words, the first outer layer circuit pattern 303A is buried in a groove formed in a lower portion of the first insulating layer 304. At this time, a lower surface of the first outer layer circuit pattern 303A is positioned higher than the lower surface of the first insulating layer 304.

The second outer layer circuit pattern 311A is positioned lower than an upper surface of the second insulating layer 308. In other words, the second outer layer circuit pattern 311A is buried in a groove formed in an upper portion of the second insulating layer 308. At this time, the second outer layer circuit pattern 311A is not formed by burying the entire groove, but may be formed by burying only a part of the groove. Therefore, the part of the groove is buried with the second outer layer circuit pattern 311A, and the remaining part is maintained in an empty state.

Accordingly, an upper surface of the second outer layer circuit pattern 311A is positioned lower than the upper surface of the second insulating layer 308.

Meanwhile, the first outer layer circuit pattern 303A and the second outer layer circuit pattern 311A include a connection pattern connected to a chip by a flip chip bonding method or a wire bonding method, and a wiring pattern for signal transmission. At this time, a surface of the connection pattern should to be exposed for connection with the chip, but a surface of the wiring pattern should be covered with a passivation layer. In other words, when the surface of the wiring pattern is exposed to the outside, a problem may occur in a signal flow due to influence from an external environment.

Therefore, in the present invention, in the first outer layer circuit pattern 303A and the second outer layer circuit pattern 311A, a passivation layer 313 is disposed on the wiring pattern. At this time, the passivation layer 313 is disposed in grooves of the first insulating layer and the second insulating layer in which the first outer layer circuit pattern 303A and the second outer layer circuit pattern 311A are buried.

In other words, a first groove portion may be formed in the lower portion of the first insulating layer 304, and a second groove portion may be formed in the upper portion of the second insulating layer 308.

In addition, the first outer layer circuit pattern 303A is formed in the first groove portion while filling only a part of the first groove portion. Further, the passivation layer 313 is formed in a remaining part of the first groove portion. Therefore, a lower surface of the passivation layer 313 disposed in the lower portion of the first insulating layer 304 is positioned on the same plane as the lower surface of the first insulating layer 304. In the present invention, as described above, the wiring pattern may be efficiently protected without increasing the overall thickness of the printed circuit board by forming the passivation layer 313 at a lower portion of the empty first groove portion.

Further, a second groove portion may be formed in the upper portion of the second insulating layer 308, and the second outer layer circuit pattern 311A may be formed in the second groove portion while filling only a part of the second groove portion. Furthermore, the passivation layer 313 is formed in a remaining part of the second groove portion. Therefore, an upper surface of the passivation layer 313 disposed at the upper portion of the second insulating layer 308 is disposed on the same plane as the upper surface of the second insulating layer 308.

Figure 21:
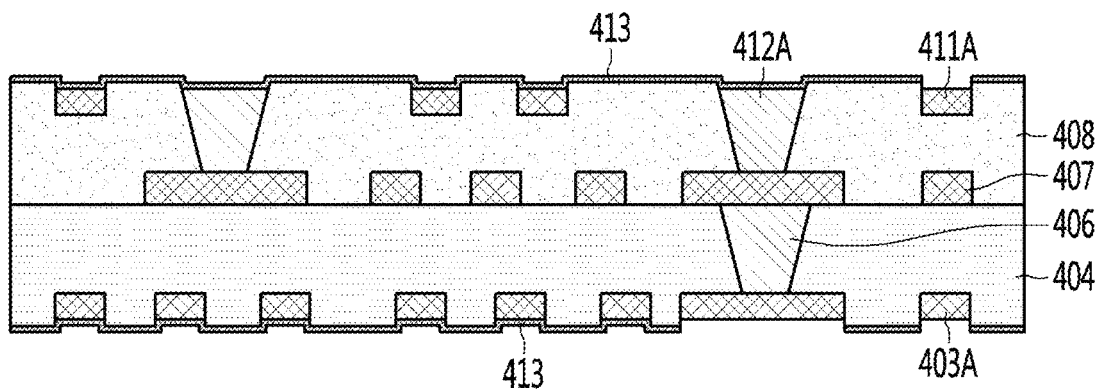
FIG. 21 shows a structure of the printed circuit board according to the fifth embodiment of the present invention.

FIG. 21 shows a structure of a printed circuit board according to a fifth embodiment of the present invention.

Referring to FIG. 21, the printed circuit board includes a first insulating layer 404, a second insulating layer 408, an inner layer circuit pattern 407, a first via 406, a second via 412A, a first outer layer circuit pattern 403A, a second outer layer circuit pattern 411A, and a passivation layer 413.

The printed circuit board according to the fifth embodiment illustrated in FIG. 21 has substantially the same structure as the remaining configuration of the printed circuit board illustrated in FIG. 3 except for the passivation layer 413.

Therefore, hereinafter, in the printed circuit board according to the fifth embodiment of the present invention, only a structure of the passivation layer 413 will be described.

The first outer layer circuit pattern 343A and the second outer layer circuit pattern 411A may be positioned on a different plane from surfaces of the first insulating layer 404 and the second insulating layer 408.

Preferably, the first outer layer circuit pattern 403A in the fifth embodiment of the present invention is positioned higher than a lower surface of the first insulating layer 404. In other words, the first outer layer circuit pattern 403A is buried in a groove formed in a lower portion of the first insulating layer 404. At this time, a lower surface of the first outer layer circuit pattern 403A is positioned higher than the lower surface of the first insulating layer 404.

The second outer layer circuit pattern 411A is positioned lower than an upper surface of the second insulating layer 408. In other words, the second outer layer circuit pattern 411A is buried in a groove formed in an upper portion of the second insulating layer 408. At this time, the second outer layer circuit pattern 411A is not formed by burying the entire groove, but may be formed by burying only a part of the groove. Therefore, the part of the groove is buried with the second outer layer circuit pattern 411A, and the remaining part is maintained in an empty state.

Accordingly, an upper surface of the second outer layer circuit pattern 411A is positioned lower than the upper surface of the second insulating layer 408.

Meanwhile, the first outer layer circuit pattern 403A and the second outer layer circuit pattern 411A include a connection pattern connected to a chip by a flip chip bonding method or a wire bonding method, and a wiring pattern for signal transmission. At this time, a surface of the connection pattern should to be exposed for connection with the chip, but a surface of the wiring pattern should be covered with a passivation layer. In other words, when the surface of the wiring pattern is exposed to the outside, a problem may occur in a signal flow due to influence from an external environment.

Therefore, in the present invention, in the first outer layer circuit pattern 403A and the second outer layer circuit pattern 411A, a passivation layer 413 is disposed on the wiring pattern. At this time, the passivation layer 413 is disposed in grooves of the first insulating layer and the second insulating layer in which the first outer layer circuit pattern 403A and the second outer layer circuit pattern 411A are buried.

In other words, a first groove portion may be formed in the lower portion of the first insulating layer 404, and a second groove portion may be formed in the upper portion of the second insulating layer 408.

In addition, the first outer layer circuit pattern 403A is formed in the first groove portion while filling only a part of the first groove portion. Further, the passivation layer 413 is formed in a remaining part of the first groove portion.

At this time, the passivation layer 413 may be disposed not only on the surface of the wiring pattern but also on a surface of the first insulating layer 404. In other words, the passivation layer 413 is disposed on the lower surface of the first insulating layer 404 and the lower surface of the first outer layer circuit pattern 403A. At this time, the lower surface of the first insulating layer 404 and the lower surface of the first outer layer circuit pattern 403A are disposed on different planes. In other words, a step is formed on the lower surface of the first insulating layer 404 and the lower surface of the first outer layer circuit pattern 403A. Therefore, in the passivation layer 413, a region disposed on the lower surface of the first insulating layer 404 and a region disposed on the lower surface of the first outer layer circuit pattern 403A may be positioned on different planes. In other words, of the lower surfaces of the passivation layer 413, the lower surface of the region disposed on the lower surface of the first insulating layer 404 may be positioned lower than the lower surface of the region disposed on the lower surface of the first outer layer circuit pattern 403A.

In addition, the second outer layer circuit pattern 411A is formed in the second groove portion while filling only a part of the second groove portion. Further, the passivation layer 413 is formed in a remaining part of the second groove portion.

At this time, the passivation layer 413 may be disposed not only on a surface of the wiring pattern but also on a surface of the second insulating layer 408. In other words, the passivation layer 413 is disposed on the upper surface of the second insulating layer 408 and the upper surface of the second outer layer circuit pattern 411A. At this time, the upper surface of the second insulating layer 408 and the upper surface of the second outer layer circuit pattern 411A are disposed on different planes. In other words, a step is formed on the upper surface of the second insulating layer 408 and the upper surface of the second outer layer circuit pattern 411A. Therefore, in the passivation layer 413, a region disposed on the upper surface of the second insulating layer 408 and a region disposed on the upper surface of the first outer layer circuit pattern 403A may be positioned on different planes. In other words, of the upper surfaces of the passivation layer 413, the upper surface of the region disposed on the upper surface of the second insulating layer 408 may be positioned higher than the upper surface of the region disposed on the upper surface of the second outer layer circuit pattern 411A.

According to the embodiment of the present invention, it is possible to form a fine pattern through a double-sided buried pattern structure, and thus a product unit cost may be reduced according to not using a special resin such as a primer resin.

In addition, according to the embodiment of the present invention, an entire thickness of the printed circuit board corresponding to a thickness of the outermost layer circuit pattern may be reduced by providing a double-sided buried structure in which the outermost layer circuit pattern is buried in an insulating layer.

Further, according to the embodiment of the present invention, a passivation layer such as a solder resist that protects a surface of the outermost layer circuit pattern may be removed by burying the outermost layer circuit pattern in an insulating layer. Accordingly, the entire thickness of the printed circuit board may be reduced corresponding to a thickness of the passivation layer.

The invention claimed is:
1. A printed circuit board comprising:
a first insulating layer;
an inner layer circuit pattern disposed on an upper surface of the first insulating layer;
a second insulating layer disposed on the first insulating layer and covering the inner layer circuit pattern;

a plurality of first groove portions formed on a lower surface of the first insulating layer;

a plurality of first outer layer circuit patterns disposed in the plurality of first groove portions, respectively;

a plurality of second groove portions formed on an upper surface of the second insulating layer;

a plurality of second outer layer circuit patterns disposed in the plurality of second groove portions, respectively;

a via passing through a portion of the second insulating layer;

a first passivation layer disposed on a lower surface of at least one of the plurality of first outer layer circuit patterns; and a second passivation layer comprising a first portion disposed on an upper surface of at least one of the plurality of second outer layer circuit patterns and a second portion entirely disposed in the via;

wherein the first insulating layer includes a thermosetting resin, and the second insulating layer includes a photocurable resin, wherein lower surfaces of the plurality of first outer layer circuit patterns are positioned higher than the lower surface of the first insulating layer, wherein upper surfaces of the plurality of second outer layer circuit patterns are positioned lower than the upper surface of the second insulating layer, wherein a width of the first portion of the second passivation layer is same as widths of the upper surfaces of the plurality of second outer layer circuit patterns, and wherein a width of the second portion of the second passivation layer is same as a width of a lower surface of the via.

2. The printed circuit board of claim 1, wherein a lower surface of the second passivation layer does not contact the second insulating layer, wherein an upper surface of the first passivation layer does not contact the first insulating layer, and wherein the first insulating layer includes glass fiber, and wherein the second insulating layer does not include the glass fiber.

3. The printed circuit board of claim 1, wherein a solder resist is not disposed on the lower surface of the first insulating layer and the upper surface of the second insulating layer, and the lower surface of the first insulating layer and the upper surface of the second insulating layer are exposed to the outside.

4. The printed circuit board of claim 1, wherein a width of the first passivation layer is same as widths of the lower surfaces of the plurality of first outer layer circuit patterns, wherein an upper surface of the via is positioned lower than the upper surface of the second insulating layer, wherein a lower surface of the via is in contact with an upper surface of the inner layer circuit pattern.

5. The printed circuit board of claim 4, wherein bottom surfaces of the second groove portions are positioned higher than the upper surface of the inner layer circuit pattern, and lower surfaces of the plurality of second outer layer circuit patterns are positioned higher than the upper surface of the inner layer circuit pattern.

6. The printed circuit board of claim 4, wherein an upper surface of the via is positioned on a same plane as the upper surfaces of the plurality of second outer layer circuit patterns.

7. The printed circuit board of claim 4, wherein a side surface of the via has a predetermined inclination angle with respect to the upper surface of the second insulating layer, and side surfaces of the plurality of second outer layer circuit patterns are perpendicular to the upper surface of the second insulating layer.

8. The printed circuit board of claim 1, wherein a lower surface of the first passivation layer is positioned on the same plane as the lower surface of the first insulating layer, and an upper surface of the second passivation layer is positioned on the same plane as the upper surface of the second insulating layer.

9. The printed circuit board of claim 8, wherein a depth of the first groove portions corresponds to a sum of a height of the first outer layer circuit pattern and a height of the first passivation layer, and wherein a depth of the second groove portions corresponds to a sum of a height of the second outer layer circuit pattern and a height of the second passivation layer.

10. A printed circuit board comprising:

a first insulating layer;

an inner layer circuit pattern disposed on an upper surface of the first insulating layer;

a second insulating layer disposed on the first insulating layer and covering the inner layer circuit pattern;

a plurality of first groove portions formed on a lower surface of the first insulating layer;

a plurality of first outer layer circuit patterns disposed in the plurality of first groove portions, respectively;

a plurality of second groove portions formed on an upper surface of the second insulating layer;

a plurality of second outer layer circuit patterns disposed in the plurality of second groove portions, respectively;

a via passing through a portion of the second insulating layer;

a first passivation layer disposed on a lower surface of at least one of the plurality of first outer layer circuit patterns; and a second passivation layer comprising a first portion disposed on an upper surface of at least one of the plurality of second outer layer circuit patterns and a second portion entirely disposed in the via;

wherein lower surfaces of the plurality of first outer layer circuit patterns have a step with the lower surface of the first insulating layer, upper surfaces of the plurality of second outer layer circuit patterns have a step with the upper surface of the second insulating layer, and a lower surface of the inner layer circuit pattern is disposed on a same plane as the upper surface of the first insulating layer and a lower surface of the second insulating layer, wherein the first insulating layer includes a thermosetting resin, wherein the second insulating layer includes a photocurable resin, wherein a lower surface of the first passivation layer is positioned on a same plane as the lower surface of the first insulating layer, wherein an upper surface of the second passivation layer is positioned on a same plane as the upper surface of the second insulating layer, wherein a width of the first portion of the second passivation layer is same as widths of the upper surfaces of the plurality of second outer layer circuit patterns, and wherein a width of the second portion of the second passivation layer is same as a width of a lower surface of the via.

11. The printed circuit board of claim 10, wherein a lower surface of the second passivation layer does not contact the second insulating layer, wherein an upper surface of the first passivation layer does not contact the first insulating layer, wherein a width of the first passivation layer is same as widths of lower surfaces of the plurality of first outer layer circuit patterns, wherein a depth of the first groove portions corresponds to a sum of a height of the first outer layer circuit pattern and a height of the first passivation layer, and wherein a depth of the second groove portions corresponds to a sum of a height of the second outer layer circuit pattern and a height of the second passivation layer.

* * * * *